United States Patent [19]

Throngnumchai

[11] Patent Number: 5,357,157
[45] Date of Patent: Oct. 18, 1994

[54] POWER MOSFET CIRCUIT INCLUDING SHORT CIRCUITING MEANS FOR DETECTING THE POTENTIAL OF THE SOURCE TERMINAL

[75] Inventor: Kraisorn Throngnumchai, Kanagawa, Japan

[73] Assignee: Nissan Motor Co., Ltd., Yokohama, Japan

[21] Appl. No.: 777,616

[22] Filed: Oct. 16, 1991

[30] Foreign Application Priority Data

Nov. 5, 1990 [JP] Japan .................................. 2-297122

[51] Int. Cl.⁵ .................. H03K 17/687; H03K 17/60; H03K 3/01
[52] U.S. Cl. ...................................... 307/570; 307/571; 307/574; 307/254; 307/270; 257/262; 257/263
[58] Field of Search ............... 307/570, 571, 574, 577, 307/584, 254, 362, 494, 572; 357/46, 51, 23.13

[56] References Cited

U.S. PATENT DOCUMENTS 4,992,836 2/1991 Sicard .................. 357/23.13
5,010,439 4/1991 Zisa et al. ................. 307/584
5,028,811 7/1991 le Roux et al. ............ 307/254

FOREIGN PATENT DOCUMENTS 59-98558 6/1984 Japan .
63-312674 12/1988 Japan .
2-46735 2/1990 Japan .

Primary Examiner—Timothy P. Callahan
Assistant Examiner—Trong Phan
Attorney, Agent, or Firm—Foley & Lardner

[57] ABSTRACT

In a high side switching circuit for switching, an inductive load with a power MOSFET on and off, whose drain is connected with a power source and whose source is connected with the inductive load, a short-circuiting means for preventing undesired turn-on of the power MOSFET by establishing a short circuit between the gate and source of the power MOSFET when the source potential of the power MOSFET becomes lower than the ground potential. Preferably, the short-circuiting means comprises a field-effect or bipolar transistor whose control electrode is grounded.

26 Claims, 4 Drawing Sheets

POWER MOSFET CIRCUIT INCLUDING SHORT CIRCUITING MEANS FOR DETECTING THE POTENTIAL OF THE SOURCE TERMINAL

BACKGROUND OF THE INVENTION

The present invention relates to a power MOSFET circuit for switching on and off an inductive load, and more specifically to a so-called high side switching circuit. The circuit according to the present invention may be an integrated circuit or a circuit of discrete components.

One conventional high side switching circuit employs a vertical power MOSFET fabricated by the double diffusion technique (as disclosed in Japanese Patent Provisional Publication No. 59-98558). The drain of the power MOSFET is connected with a power supply, and the source is grounded through an inductive load.

In this high side switching circuit, a counter electromotive force is produced across the inductive load when the power MOSFET turns off to switch off the inductive load. Because of this counter electromotive force, the source potential of the power MOSFET becomes negative and lower than the ground potential. As a result, the gate potential of the power MOSFET becomes higher than the source potential, and the power MOSFET turns on again. This undesired on/off phenomenon continues while decaying until the current is reduced almost to zero by an internal resistance of the circuit. Therefore, the switching operation of the power MOSFET from the ON state to the OFF state requires a considerable time determined by a time constant of a loop circuit formed by the power source, power MOSFET and the inductive load. This conventional switching circuit is unsatisfactory because of its slower switching speed especially when it is used for switching a load of a valve in a hydraulic system of an automobile where a high speed switching-off operation is required.

Furthermore, this conventional switching circuit is susceptible to surge. The inductive load tends to receive adverse influences of a nearby current flow due to induction, and a counter electromotive force can be readily produced between both ends of the inductive load by a surge. If such a counter electromotive force is produced while the inductive load is in the OFF state, then the source potential of the power MOSFET becomes lower than the ground potential (=the gate potential), and accordingly the power MOSFET is erroneously turned on and causes a malfunction of the inductive load.

To overcome these problems, a flyback diode is used in another conventional circuit. The diode is connected between both ends of the inductive load, and the anode of the diode is grounded. The cathode of the diode is connected to a branch point between the inductive load and the source of the power MOSFET. During normal operation, the source potential of the power MOSFET is equal to or higher than the ground potential, so that the flyback diode is reverse biased and held in the OFF state. If a counter electromotive force is produced across the inductive load, the source potential of the power MOSFET decreases below the ground potential, and the flyback diode is put in the forward bias condition. In this condition, the flyback diode permits current flow in a loop formed by the diode and the inductive load and by so doing, holds the source potential of the power MOSFET at the level of the ground potential to prevent an undesired turnon of the power MOSFET.

In this conventional configuration, however, the flyback diode must handle a heavy current flow in the load, so that the current-carrying capacity of the diode must be sufficiently high. Furthermore, an equivalent impedance (R) of the loop is low since the flyback diode is forward biased. Therefore, a time constant $\tau$ ($=L/R$) describing the decay of current in the loop of the inductive load (L) and the diode becomes greater, and the switching-off time of the inductive load becomes longer.

SUMMARY OF THE INVENTION

It is an object of the present invention to provide a power MOSFET circuit (or high side switching circuit) which has the advantages of speed in switching off an inductive load, and immunity from malfunctions due to surges.

According to the present invention, a power MOSFET circuit (or high side switching circuit) comprises a power MOSFET for switching on and off an inductive load, and a short-circuiting (or shorting) means. The power MOSFET comprises a drain terminal adapted to be connected with a power source, a source terminal adapted to be connected with the inductive load, and a gate terminal for receiving a gate input signal. The short-circuiting means is a component, or a group of components, for short-circuiting the gate and source terminals of the power MOSFET when a potential of the source terminal of the power MOSFET is lower than a ground potential. Preferably, the short-circuiting means comprises a short-circuiting transistor, such as a MOSFET or an NPN bipolar transistor, for making and breaking a short circuit between the gate and source terminals of the power MOSFET, and the control electrode of the short-circuiting transistor is connected to the ground.

When the potential at the source terminal of the power MOSFET is made lower than the ground potential by a counter electromotive force of the inductive load, then the short-circuiting means of the invention prevents the power MOSFET from being turned on by the decrease of the source potential. Therefore, the short-circuiting means can shorten the time interval required for completing a switching-off operation, and prevent malfunctions due to surges. The short-circuiting means is not required to carry heavy current. Therefore, it is possible to employ a thin film transistor or the like as the short-circuiting transistor, and it is easy to integrate the short-circuiting means with the power MOSFET.

The power MOSFET circuit according to the present invention may be a circuit of discrete circuit components or may be a semiconductor device such as an integrated or hybrid circuit.

DETAILED DESCRIPTION OF THE INVENTION

Figure 1:
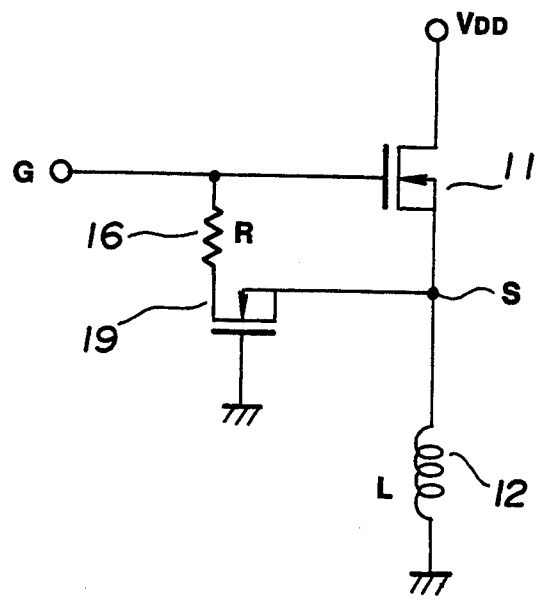
FIG. 1 is a circuit diagram showing a power MOSFET circuit according to a first embodiment of the present invention.
Figure 2:
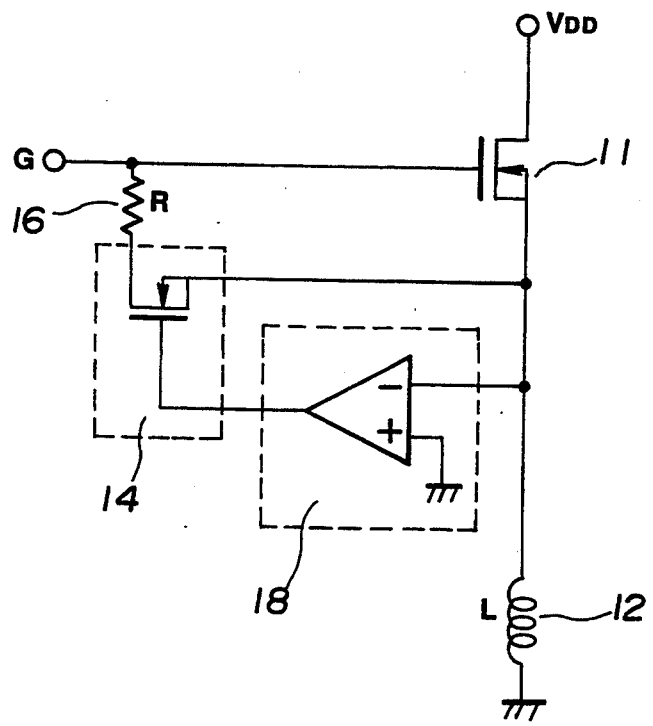
FIG. 2 is a circuit diagram showing a power MOSFET circuit according to a second embodiment of the present invention.

FIGS. 1 and 2 show, respectively, first and second embodiments according to the present invention.

To facilitate understanding the invention, reference is first made to the second embodiment shown in FIG. 2.

A power MOSFET circuit (or high side switching circuit) shown in FIG. 2 comprises a main power MOSFET 11 (such as a vertical double diffused MOSFET), a MOSFET 14 for making a gatesource short circuit, and a comparator 18 for detecting a source potential.

The power MOSFET 11 is used as a switching device for on/off switching operations of an inductive load 12, such as a load in a valve used for a hydraulic system of a motor vehicle. The power MOSFET has a drain terminal which is connected with a power supply (VDD), a source terminal S which is grounded through the inductive load 12, and a gate terminal G. That is, one end of the inductive load 12 is connected with the source terminal of the power MOSFET 11, and the other end of the inductive load 12 is grounded. This configuration is known as a high side switching configuration. The power MOSFET 11 turns on and off in response to a gate input signal inputted to the gate terminal G, and by so doing, switches on and off the inductive load 12.

The source potential detecting comparator 18 has a first input terminal connected with the source terminal S of the power MOSFET 11, a second input terminal which is grounded, and an output terminal connected with the short-circuiting MOSFET 14.

The short-circuiting MOSFET 14 has a drain terminal connected through a resistor 16 with the gate terminal G of the power MOSFET 11, a source terminal connected with the source terminal S of the power MOSFET 11, and a gate terminal which is connected with the output terminal of the comparator 18.

The MOSFET circuit of this embodiment is operated as follows:

When the source potential of the power MOSFET 11 is made lower than the ground potential by a counter electromotive force which is developed across the inductive load 12 by a turn-off of the power MOSFET 11, an externally induced surge or other disturbance, the output of the comparator 18 is brought to a HIGH state. In response to this, the short-circuiting MOSFET 14 turns on, and establishes a short circuit between the gate and source terminals G and S of the power MOSFET 11, to hold the power MOSFET in the OFF state. Therefore, this power MOSFET circuit can reliably hold the power MOSFET in the OFF state despite the counter electromotive force, and switches off the inductive load 12 rapidly. This power MOSFET circuit can reduce the switch-off time of the inductive load 12, and prevent the inductive load 12 from being erroneously switched on by a surge.

The short-circuiting MOSFET 14 returns to the OFF state when the counter electromotive force disappears. Therefore, the power MOSFET 11 can be quickly turned on again. In this case, a charging process begins immediately for a gate capacitance of the power MOSFET 11 without waiting for a turn-off of the short-circuiting MOSFET 14. Therefore, this power MOSFET circuit can improve the switching-off speed of the inductive load 12, and prevent malfunction of the inductive load 12 without increasing the switching-on time of the inductive load 12.

The power MOSFET circuit of FIG. 2 includes not only a first loop circuit formed by the power source $V_{DD}$, the power MOSFET 11 and the inductive load 12, but also a second loop circuit formed by the comparator 18 and the short-circuiting MOSFET 14. Therefore, in order to increase the switching-off speed, it is required to increase the impedance of the second loop circuit. To this purpose, the resistor 16 is connected between the gate terminal G of the power MOSFET 11 and the drain terminal of the short-circuiting MOSFET 14. Another method for this purpose is to insert a diode between the ground and a ground terminal of a control circuit (not shown) for supplying the gate input signal to the gate terminal G of the power MOSFET 11.

In the embodiment shown in FIG. 2, the short-circuiting MOSFET 14, the comparator 18, and the resistor 16 serve as a short-circuiting means for establishing a short circuit between the gate and source terminals of the power MOSFET 11.

FIG. 1 shows a power MOSFET circuit (high side switch circuit) according to the first embodiment of the invention. The power MOSFET circuit shown in FIG. 1 includes a short-circuiting MOSFET 19 which combines the functions of the comparator 18 and the short-circuiting MOSFET 14 of FIG. 2.

The short-circuiting MOSFET 19 is connected between the gate and source terminals G and S of the power MOSFET 11, as shown in FIG. 1. The short-circuiting MOSFET 19 has a source terminal connected with the source terminal S of the power MOSFET 11, a drain terminal connected through a resistor 16 with the gate terminal G of the power MOSFET 11, and a gate terminal (or control terminal). In this embodiment, the gate (control) terminal of the short-circuiting transistor 19 is grounded. The control terminal of the short-circuiting transistor 19 is fixed at the ground potential.

The power MOSFET circuit show in FIG. 1 is operated as follows: The source terminals of the power MOSFET 11 and the short-circuiting MOSFET 19 are connected together. Therefore, if the source potential of the power MOSFET 11 becomes lower than the ground potential because of a counter electromotive force, the source potential of the short-circuiting MOSFET 19 also becomes lower than the ground potential. In the short-circuiting MOSFET 19 of this embodiment, the gate potential is fixed at the ground potential. Therefore, the decrease of the source potential of the MOSFET 19 below the ground potential turns on the MOSFET 19. In this way, the short-circuiting MOSFET 19 establishes the short circuit between the source and gate terminals of the power MOSFET 11 when the source potential of the power MOSFET 11 becomes lower than the ground potential.

In this configuration in which the control voltage (or gate voltage) is fixed, the short-circuiting MOSFET 19 is endowed with both the ability of detecting the source potential of the power MOSFET 11, and the ability of forming a short circuit between the gate and source of the power MOSFET 11. The power MOSFET circuit shown in FIG. 1 is advantageous in its simple configuration, and reduction of the number of circuit components.

The short-circuiting MOSFET 19 shown in FIG. 1 acts as a means for discharging the gate of the power MOSFET 11, to the source. Therefore, there is no need for increasing the on current as long as the ratio between currents in the on and off states of the MOSFET 19 is proper. Therefore, the short-circuiting transistor 19 can be fabricated by the thin film technology, as shown in FIG. 3.

Figure 3:
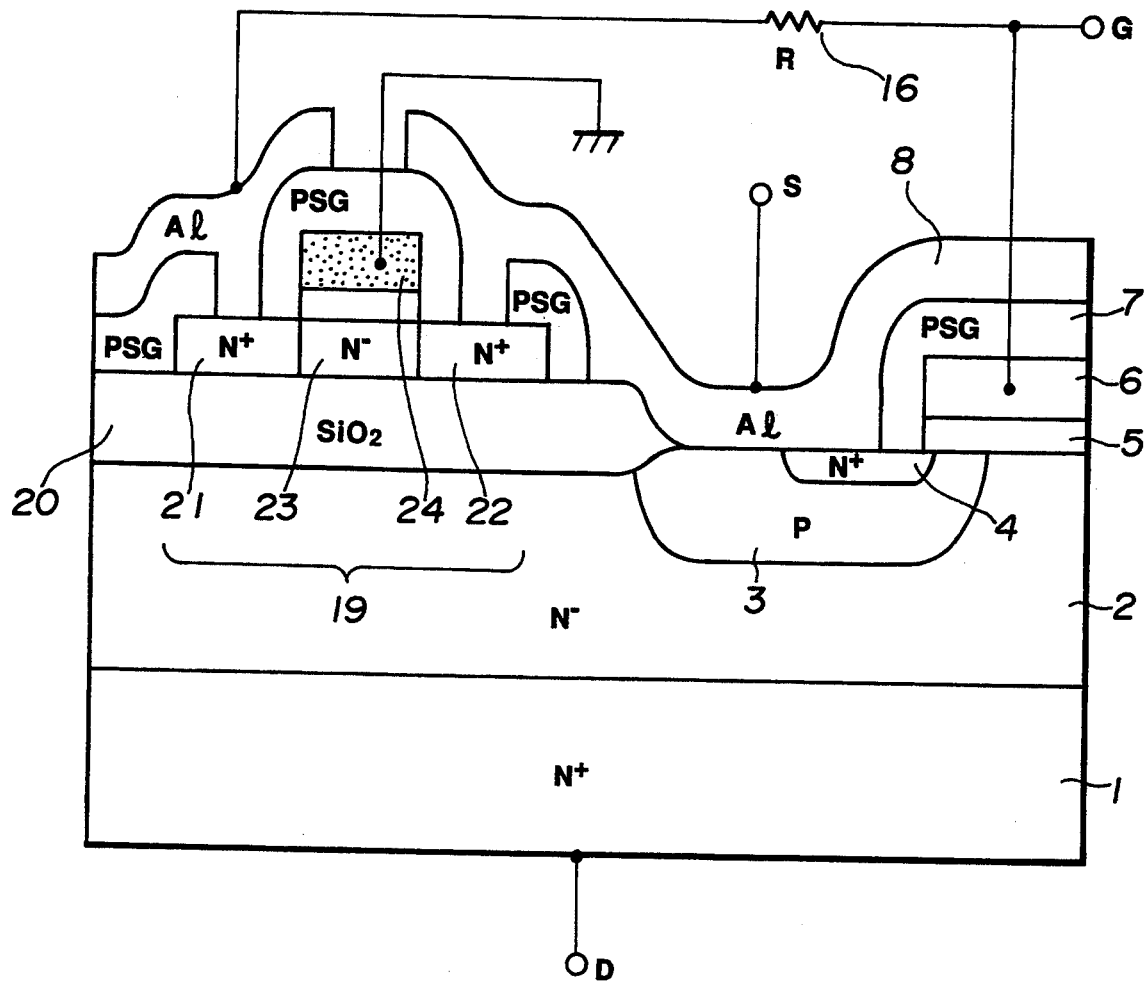
FIG. 3 is a sectional view showing a semiconductor structure employed in the first embodiment.

In the example shown in FIG. 3, the short-circuiting transistor 19 is in the form of a polysilicon thin film transistor (TFT), and integrated with the power MOSFET 11 into an IC. The power MOSFET 11 is formed in the right half of the structure shown in FIG. 3, and the short-circuiting thin film transistor 19 is formed in the left half.

As shown in FIG. 3, the power MOSFET 11 comprises a highly doped n-type silicon substrate 1, an n-type epitaxial layer 2 formed on the substrate 1, a p-type channel region 3 formed in a predetermined portion of the epitaxial layer 2,-and a highly doped n-type source region 4 formed in the channel region 3. A gate $SiO_2$ film 5 is formed in a predetermined area on the surface of the channel region 3. The power MOSFET 11 has a gate polysilicon film 6 which is formed on the gate $SiO_2$ film 5 and which is used as a gate electrode. The gate polysilicon film 6 and the source region 4 are formed by the self aligning technique. The power MOSFET 11 further has a source electrode 8 which is formed over the source region 4 and the channel region 3, and a drain electrode formed on the back side of the silicon substrate 1. The source electrode 8 is separated from the gate polysilicon film 6 by a layer insulating PSG film 7. The MOSFET structure of this type is disclosed in many documents. One example is the above-mentioned Japanese Patent Provisional Publication No. 59-98558.

The short-circuiting TFT 19 is formed on a field oxide layer 20 which is formed on the epitaxial layer 2. The TFT 19 comprises a drain region 21, a source region 22 and a channel region 23. A gate electrode 24 is formed on a gate $SiO_2$ film which is formed on the channel region 23. In this example, the channel region 23 of the $N^-$-type is formed between the drain and source regions 21 and 22 of the $N+$-type. The source region 22 of the TFT 19 is connected with the source electrode 8 of the power MOSFET 11. The gate electrode 24 is connected with a ground terminal. The drain region 21 is connected with the gate terminal G of the power MOSFET 11 through the resistor 16 (or directly). This thin film hybrid circuit structure facilitates the integration of the short-circuiting transistor 19 with the power MOSFET 11. The TFT 19 is completely insulated from the epitaxial substrate (1 and 2) by the $SiO_2$ layer 20. Therefore, this structure is resistant to parasitic components, and is immune from latchup.

Figure 4:
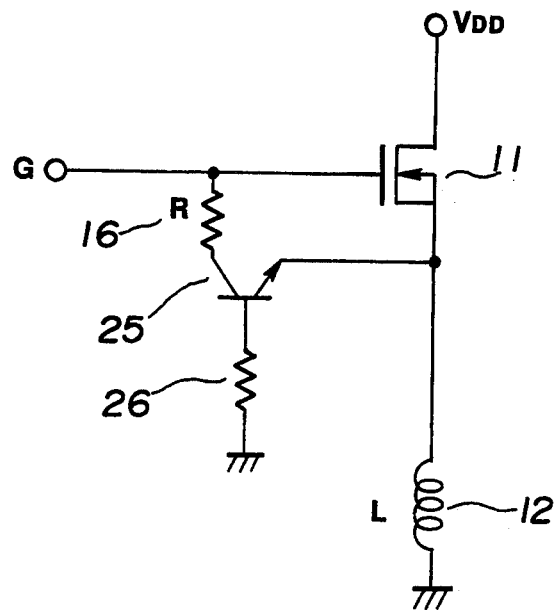
FIG. 4 is a circuit diagram showing a power MOSFET circuit according to a third embodiment of the invention.

FIG. 4 shows a power MOSFET circuit according to a third embodiment of the present invention. In this embodiment, a bipolar transistor 25 is substituted for the short-circuiting MOSFET 19 shown in FIG. 1. In this example, the transistor 25 is an NPN bipolar transistor. The power MOSFET circuit employing the bipolar transistor as the short-circuiting transistor facilitates determination of the threshold voltage, and design of the circuitry. In this example, the bipolar transistor 25 turns on when the source potential of the power MOSFET 11 becomes equal to or lower than $-0.6$ V.

Figure 5:
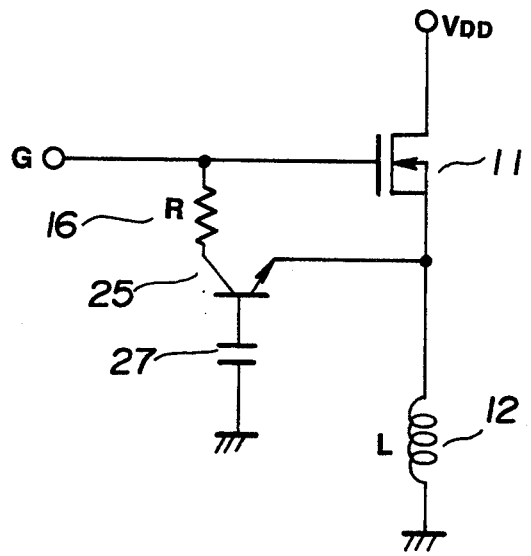
FIG. 5 is a circuit diagram showing a variation of the third embodiment.

In the bipolar transistor arrangement, however, an emitterbase junction diode of the bipolar transistor 25 and the inductive load 12 form a flyback loop. In order to increase the impedance of this flyback loop, a resistor 26 is connected between the base of the bipolar transistor 25, and the ground, as shown in FIG. 4. FIG. 5 shows a variation of this embodiment. The power MOSFET circuit shown in FIG. 5 employs a capacitor (or condenser) 27 in place of the resistor 26 of FIG. 4. In the circuit shown in FIG. 5, the bipolar transistor 25 follows only sharp changes of the power MOSFET 11.

In the circuits of FIG. 4 or 5, the current amplification factor (or current gain) hFE of the bipolar transistor 25 need not be greater than one, unlike bipolar transistors in conventional circuits, and an emitter-base withstand voltage is required. Therefore, it is possible to fabricate the bipolar transistor 25 by utilizing the collector and emitter of a ordinary NPN bipolar transistor inversely as the emitter and collector. Alternatively, it is possible to employ a polysilicon bipolar transistor. Structures and fabricating processes of polysilicon bipolar transistors are disclosed in a U.S. patent application Ser. No. 07/596,750 (corresponding to Japanese Patent Provisional Publication No. Sho 63-312674), and a Japanese Patent Provisional Publication No. Hei 2-46735.

Figure 6:
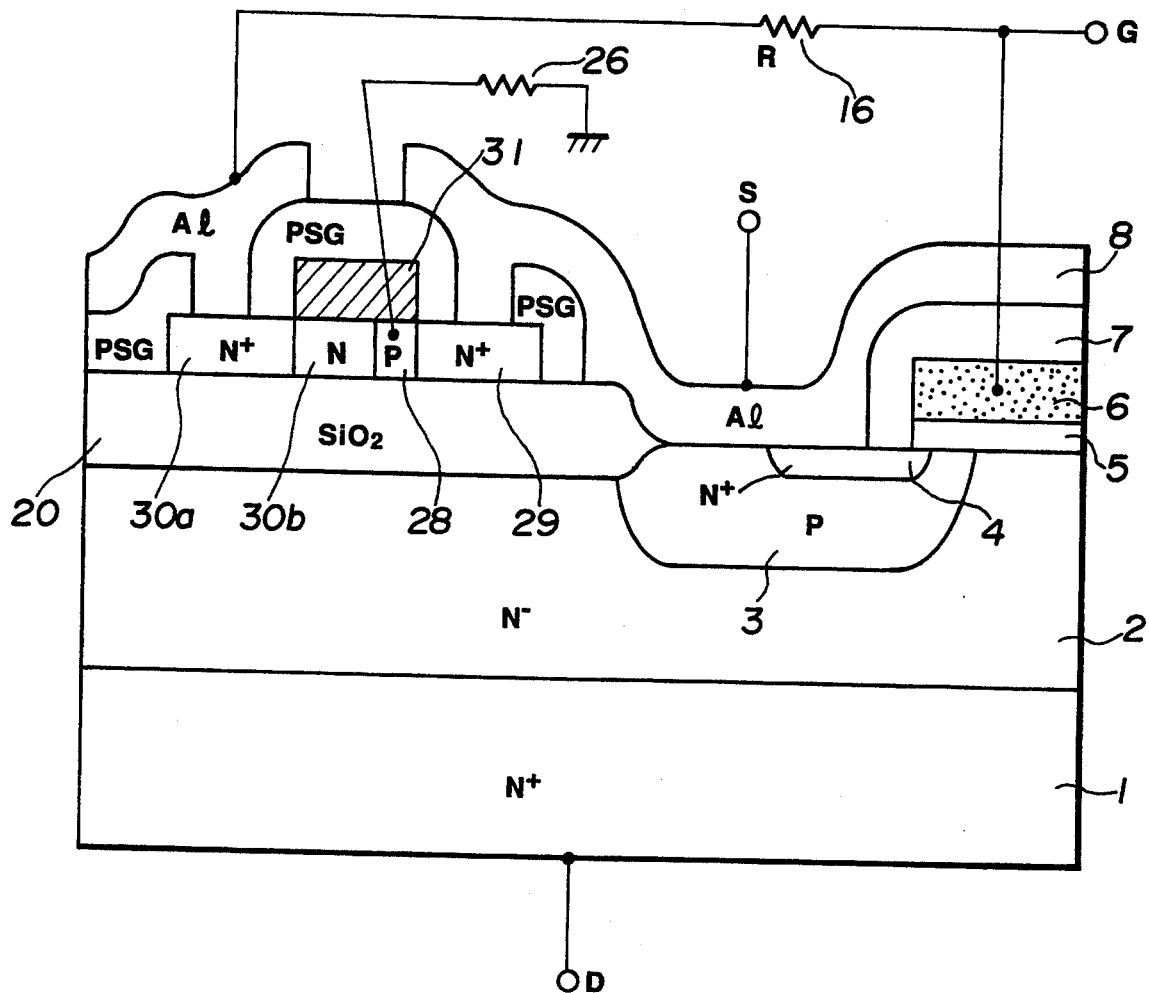
FIG. 6 is a sectional view showing a semiconductor structure employed in the third embodiment.

FIG. 6 shows a semiconductor structure employed in the third embodiment. A lateral bipolar transistor is formed, with the interposition of a field oxide layer 20, on a portion of the epitaxial substrate. The power MOSFET 11 is formed elsewhere in the epitaxial substrate. The lateral bipolar transistor comprises a base region 28, an emitter region 29 and a collector region 30. A layer 31 is a mask layer used for double diffusion. The base and emitter regions 28 and 29 are formed by the double diffusion technique so as to form a self aligning structure, and separated. In this example, the collector region 30 comprises an $N+$-type subregion 30a and an N-type subregion 30b. The P-type base region 28 is sandwiched between the $N+$-type emitter region 29 and the N-type collector subregion 30b.

The power MOSFET circuit according to the present invention is advantageous in that it can improve the switching-off speed of the power MOSFET, increase the impedance of the flyback loop, reduce the turn-on time of the power MOSFET, and prevent malfunction of the power MOSFET due to surge. The short-circuiting means of the present invention is not required to carry high current. Therefore, the integration of the short-circuiting transistor with the power MOSFET is easy, especially when a TFT or polysilicon bipolar transistor structure is employed.

What is claimed is:

1. A power MOSFET circuit comprising:
   a power MOSFET for switching on and off an inductive load in response to a gate input signal, said power MOSFET comprising a drain terminal connected with a power source, a source terminal connected with the inductive load, a gate terminal for receiving said gate input signal; and
   a short-circuiting means for detecting a potential of said source terminal of said power MOSFET and short-circuiting said gate and source terminals of said power MOSFET only when the potential of said source terminal of said power MOSFET is lower than a ground potential;
   wherein said short-circuiting means includes a means for detecting said potential of said source terminal of said power MOSFET and forming a short circuit between said gate and source terminals of said power MOSFET only when said potential of said source terminal is lower than said ground potential.

2. A power MOSFET circuit according to claim 1 wherein said short-circuiting means comprises a first terminal connected with said gate terminal of said power MOSFET, a second terminal connected with said source terminal of said power MOSFET, and a third terminal which is a ground terminal and wherein said power MOSFET is an enhancement mode MOSFET, and said short-circuiting means short-circuits said gate and source terminals of said power MOSFET to hold said power MOSFET in an off state.

3. A power MOSFET circuit according to claim 2 wherein said short-circuit means comprises a short-circuiting transistor for making the short circuit between said gate and source terminals of said power MOSFET when said short-circuiting transistor is turned on, and breaking the short circuit when said short-circuiting transistor is turned off, said short circuiting transistor comprising a first electrode connected with said gate terminal of said power MOSFET, a second electrode connected with said source terminal of said power MOSFET, and a third electrode which is a control electrode for controlling current flow between said first and second electrodes.

4. A power MOSFET circuit according to claim 3 wherein said short-circuiting means comprises a comparator for comparing said potential of said source terminal of said power MOSFET with said ground potential, said comparator comprising a first input terminal connected with said source terminal of said power MOSFET, a second input terminal which is grounded, and an output terminal which is connected with said third electrode of said short-circuiting transistor.

5. A power MOSFET circuit according to claim 3 wherein said short-circuiting means further comprises a short-circuiting resistor through which said first electrode of said short-circuiting transistor is connected with said gate terminal of said power MOSFET.

6. A power MOSFET circuit according to claim 3 wherein said third electrode of said short-circuiting transistor is grounded.

7. A power MOSFET circuit according to claim 3 wherein said short-circuiting transistor is a field-effect transistor, and comprises a drain region to which said first electrode is connected, and a source region to which said second electrode is connected, said third electrode being used as a gate electrode.

8. A power MOSFET circuit according to claim 7 wherein said short-circuiting transistor is an N-type field-effect transistor.

9. A power MOSFET circuit according to claim 3 wherein said short-circuiting transistor is a bipolar transistor, and comprises a base electrode which is grounded, an emitter electrode which is connected with said source terminal of said power MOSFET, and a collector electrode which is connected with said gate terminal of said power MOSFET.

10. A power MOSFET circuit according to claim 9 wherein said short-circuiting transistor is an NPN transistor.

11. A power MOSFET circuit according to claim 9 wherein said short-circuiting means further comprises a grounding resistor through which said base electrode of said short-circuiting transistor is grounded.

12. A power MOSFET circuit according to claim 9 wherein said short-circuiting means further comprises a capacitor through which said base electrode of said short-circuiting transistor is grounded.

13. A power MOSFET circuit according to claim 3 wherein said power MOSFET is formed in a semiconductor substrate, and said short-circuiting transistor is formed in a semiconductor film which is formed on a surface insulating layer formed on said substrate.

14. A power MOSFET circuit according to claim 3 wherein said power MOSFET comprises a source region formed in said substrate which is a single crystal silicon substrate, and said short-circuiting transistor comprises at least one region formed in said film which is a polysilicon film.

15. A power MOSFET circuit according to claim 13 wherein said third electrode of said short-circuiting transistor is grounded.

16. A power MOSFET circuit according to claim 15 wherein said short-circuiting transistor is a thin film transistor.

17. A power MOSFET circuit according to claim 16 wherein said short-circuiting transistor is a MOSFET.

18. A power MOSFET circuit according to claim 15 wherein said short-circuiting transistor is a bipolar transistor.

19. A power MOSFET circuit according to claim 13 wherein said power MOSFET is a vertical MOSFET, and comprises an insulated gate electrode formed on a first major surface of said substrate and a drain electrode formed on a second major surface of said substrate, and said short-circuiting transistor is a lateral type transistor formed in said semiconductor film formed through said surface insulating layer which is formed on said first surface of said substrate.

20. A power MOSFET circuit according to claim 1 wherein said power MOSFET comprises a source region which is formed within a semiconductor substrate, and said short-circuiting means is formed on a surface insulating layer which is formed on said substrate.

21. A power MOSFET circuit according to claim 1, wherein said power MOSFET is an enhancement mode MOSFET, and said short-circuiting means turns off said power MOSFET by forming a short-circuit between said gate and source terminals of said power MOSFET.

22. A semiconductor device comprising:
a drain region of a first conductivity type formed in a semiconductor substrate;
a channel region of a second conductivity type which si formed in said semiconductor substrate and which is in contact with said drain region;
a source region of the first conductivity type formed in said channel region;
a source electrode which is in contact with said source region;
a gate insulating layer formed on a surface of said channel region between said drain region and source region;
a gate electrode which is formed on said gate insulating layer and which forms a power enhancement mode MOSFET with said drain region, said channel region, said source region and said source electrode; and
a short-circuiting means for short-circuiting said gate and source electrodes of said power MOSFET only when a potential of said source electrode of said power MOSFET is lower than a ground potential, said short-circuiting means being formed through a surface insulating layer formed on said semiconductor substrate.

23. A semiconductor device according to claim 22 wherein said short-circuiting means comprises a short-circuiting transistor comprising a first electrode connected with said gate electrode of said power MOSFET, a second electrode connected with said source electrode of said power MOSFET, and a control electrode which is grounded, said short-circuiting transistor being formed in a semiconductor film which is formed on said surface insulating layer formed on said semiconductor substrate.

24. A semiconductor device according to claim 23 wherein said short-circuiting transistor is a field-effect transistor, and comprises a drain region to which said first electrode is connected, a source region to which said second electrode is connected, a channel region which is bounded on both sides by said drain and source regions of said short-circuiting transistor, a gate insulating layer formed on said channel region, said control electrode of said short-circuiting transistor being formed on said gate insulating layer of said short-circuiting transistor, said drain, source and channel regions of said short-circuiting transistor being all formed in said semiconductor film which is a polysilicon film.

25. A semiconductor device according to claim 23 wherein said short-circuiting transistor is a bipolar transistor, and comprises a collector region to which said first electrode is connected, an emitter region to which said second electrode is connected, and a base region to which said control electrode is connected, said collector, emitter and base regions being formed in said semiconductor film which is a polysilicon film. pg,22

26. A semiconductor device according to claim 23 wherein each of said drain, channel and source regions of said power MOSFET extends into said semiconductor substrate from a first major surface of said semiconductor substrate, and said semiconductor device further comprises a highly doped bottom layer of the first first conductivity type which is formed in said semiconductor substrate and which is bounded on both sides by a second major surface of said semiconductor substrate and said drain region of said power MOSFET, and a bottom drain electrode which is formed on said second major surface of said semiconductor substrate.

* * * * *